United States Patent [19]
Cooper, Jr.

[11] 3,937,985
[45] Feb. 10, 1976

[54] APPARATUS AND METHOD FOR REGENERATING CHARGE

[75] Inventor: James Albert Cooper, Jr., Millington, N.J.

[73] Assignee: Bell Telephone Laboratories, Incorporated, Murray Hill, N.J.

[22] Filed: June 5, 1974

[21] Appl. No.: 476,702

[52] U.S. Cl.................. 307/221 D; 307/304; 357/24
[51] Int. Cl.²................... H01L 27/10; H01L 29/78
[58] Field of Search ........... 357/24; 307/304, 221 D

[56] References Cited
UNITED STATES PATENTS

| | | | |
|---|---|---|---|
| 3,760,202 | 9/1973 | Kosonocky | 357/24 |
| 3,777,186 | 12/1973 | Chang | 307/304 |
| 3,806,772 | 4/1974 | Early | 357/24 |
| 3,831,041 | 8/1974 | Krambeck et al. | 307/304 |
| 3,838,438 | 9/1974 | Silversmith et al. | 307/221 D |

OTHER PUBLICATIONS
Carnes et al., "Measurements of Noise in CCDs," RCA Review, Dec. 1973, pp. 554 and 561–2.
Mok et al., "Logic Array Using Charge-Transfer Devices," Electronics Letters, Oct. 5, 1972, Vol. 8, No. 20, pp. 495–496.
Emmons et al., Solid–State Device Research Conf. Abstracts, IEEE Trans. on Electron Devices, Dec. 1973, p. 1172, abstract No. 3, ". . . Low Noise Fat Zero in CCD's".

*Primary Examiner*—William D. Larkins
*Attorney, Agent, or Firm*—L. C. Canepa; D. I. Caplan

[57] ABSTRACT

An apparatus and a method for regenerating charge packets representing logical information in a charge transfer device uses a pattern of field plate electrodes and impurity zones to perform arithmetic operations. To regenerate a charge packet it is first multiplied by a factor dependent upon transfer imperfections. Then an amount of charge representing a logical 0 is substracted from the charge packet. Finally, the magnitude of the charge packet is limited to the amount of charge representing a logical 1.

25 Claims, 11 Drawing Figures

APPARATUS AND METHOD FOR REGENERATING CHARGE

BACKGROUND OF THE INVENTION

This invention relates generally to charge transfer devices; and, more particularly, to an apparatus and a method for regenerating charge packets representing information in a semiconductor charge transfer device.

A component utilized in some practical applications of charge transfer devices is a charge regenerator. The regenerator is used to reduce deviations from the correct amount of charge in a charge packet representing either a logical 1 or a logical 0. Without regeneration the amount of charge in a packet representing a logical 1 and the amount of charge in a packet representing a logical 0 tend to equalize, making discrimination between the two more difficult and eventually resulting in a loss of information.

Known prior art methods typically have used a threshold or reference voltage in a charge regenerator. Such a regenerator is described by M. F. Tompsett in an article entitled "A Simple Charge Regenerator for Use with Charge Transfer Devices and the Design of Functional Logic Arrays," appearing in the IEEE Journal of Solid State Circuits, June, 1972, page 237. In the described regenerator the flow of charge carriers from a charge source is controlled by a potential barrier whose level is a function of the charge to be regenerated. A threshold or reference voltage is applied to the charge carrier source. The voltage is set to a potential level between the level of the potential barrier representing a logical 1. and the level of the potential barrier representing a logical 0. Therefore, charge flows from the source when there is a potential barrier representing a logical 0 and does not flow when there is a potential barrier representing a logical 1.

As the overall transfer efficiency approaches 50 percent, the separation between the potential level representing a logical 1 and the potential level representing a logical 0 diminishes and the requirements on the stability of the reference voltage becomes severe. The reference voltage is often derived using an on-chip voltage regulator which depends upon the difficult-to-control threshold voltages of insulated gate field effect transistors. Also, regeneration as taught in the Tompsett article results in an inversion of logical 1—s and 0+s. It would be desirable to eliminate the need for a threshold voltage and its associated voltage regulator. It would further be desirable to regenerate charge packets representing information without inverting.

Other prior art teaches performing various arithmetic and logic functions using charge transfer devices. For example, U.S. Pat. No. 3,777,186, issued to W. H. Chang on Dec. 4, 1973 and an article by T. D. Mok and C. A. T. Salama entitled "Logic Array Using Charge Transfer Devices" appearing in Electronics Letters, Vol. 8, No. 20, Oct. 5, 1972, page 495, describe performing logic functions using charge transfer devices. The logic functions are obtained by using parallel and serial gates to perform operations akin to charge limitation and charge subtraction. However, it is neither taught nor suggested that such techniques can be used to regenerate charge in charge transfer devices.

SUMMARY OF THE INVENTION

A charge packet from a charge transfer device is regenerated in accordance with this invention by performing arithmetic operations on the charge in the packet. The charge is first multiplied so the difference in the amount of charge in a charge packet representing a logical 1 and in a charge packet representing a logical 0 is at least as great as the charge storage capacity of a potential well of the charge transfer device. It can be appreciated that the multiplication factor depends on the charge transfer imperfections of the charge transfer device. Then a fixed quantity of charge is subtracted from the multiplied charge packet. The fixed quantity is sufficient to remove all the charge if the charge packet represents a logical 0. Then the remaining amount of charge in a packet representing a logical 1 is limited to a maximum value equal to the charge storage capacity of a potential well of the charge transfer device.

Once the multiplication factor and the amount to be subtracted are determined for a given transfer efficiency, they can also be used for any improved transfer efficiency. As transfer efficiency improves, the amount of charge in a packet representing a logical 0 tends to decrease. Therefore the fixed quantity subtracted remains sufficient to remove all the charge. As transfer efficiency improves, the amount of charge in a packet representing a logical 1 tends to increase. Therefore, since the difference in the amount of charge representing a logical 1 and logical 0 tends to increase, the multiplication factor remains adequate.

The arithmetic operations are done by using a well controlled geometric layout of transfer electrodes in combination with impurity zones. As a result of relying upon geometry rather than upon voltage levels for discriminating between a logical 1 and 0, the regenerator is relatively insensitive to process variation of such parameters as threshold voltage and substrate doping.

To multiply, the charge packets in a charge transfer device are used to establish a potential barrier between a charge source and a charge storage region under an amplification electrode. A voltage pulse of greater magnitude than the potential barrier is applied to the charge source and the charge storage region is filled with charge carriers. When the voltage pulse is removed from the charge source, the potential level of the charge source is less than the level of the potential barrier. Charge carriers at a potential level greater than the potential barrier flow from the charge storage region back to the charge source.

More specifically, a sensing impurity zone in the charge flow path of the charge transfer device detects the amount of charge in a charge packet and establishes a surface potential. A control electrode contacts the sensing impurity zone and extends over an insulating layer to the region between the charge source and the charge storage region. Thus, when a charge packet enters the sensing impurity zone, a voltage proportional to the size of the charge packet appears on the control gate to form the potential barrier across the charge flow path between the charge source and charge storage region. The amount of charge stored under the amplifying gate in an amplifying potential well is varied by the height of the potential barrier in conjunction with the capacitance of the amplifying gate. The ratio of the capacitance of the amplifying gate to the capacitance of the sensing diffusion determines the amount of amplification of the charge packet.

The voltage pulse applied to the charge source is of shorter duration than the length of time a charge packet remains in the sensing impurity zone so the potential barrier remains longer than the charge source is supplying charge. Accordingly, when the potential barrier is still in place and the voltage pulse is not applied to the charge source, the excess charge in the potential well under the amplifying gate can drain off back to the charge source. This leaves the potential level of the charge in the amplification potential well the same as the potential level of the potential barrier. To increase the amplification factor and therefore the amount of charge under the amplifying gate, the capacitance of the amplifying gate can be increased.

To subtract, the amplified charge in the amplifying potential well is shifted and split between a branching subtraction charge flow path and a main charge flow path. In the subtraction path is a subtraction electrode with an underlying subtraction potential well. The charge storage capacity of the well is equal to the amount to be subtracted. As stated, this is the amount of charge representing a logical 0. Any charge which cannot enter the subtraction path enters the main charge flow path.

The charge in the main charge flow path is transferred to a limiting electrode which has a potential charge storage well. Charge in excess of the amount stored in the potential well is transfered down an excess charge path to a charge sink. The charge storage capacity of the potential well is equal to the amount of charge needed to represent a logical 1. Of course, when the charge packet represents a logical 0 the amount of charge stored may be less than the capacity of the potential well. The charge in the potential well is then transfered to the output of the charge regenerator.

DETAILED DESCRIPTION

Figure 1:
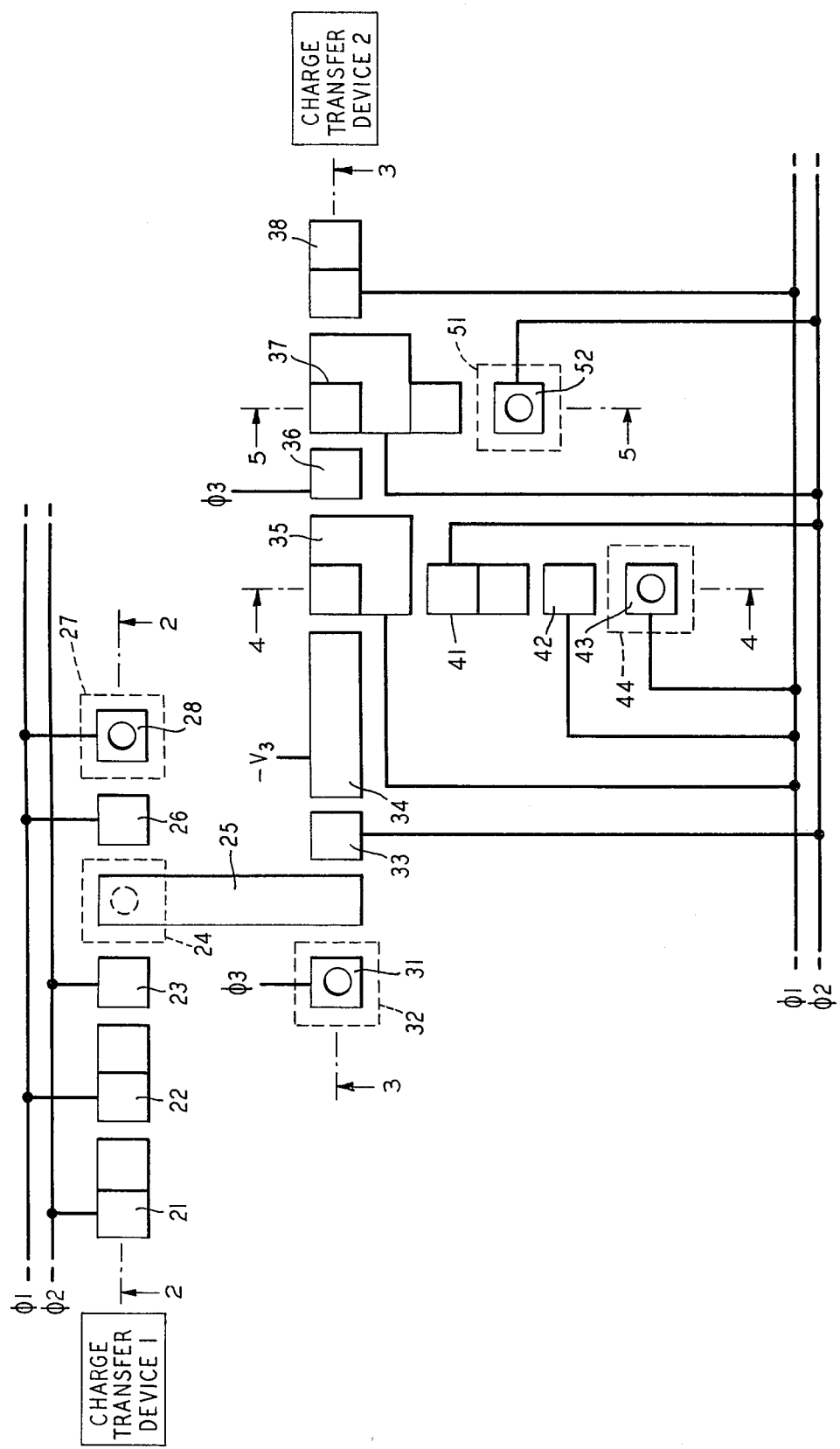
FIG. 1 shows a schematic plan view of the layout of the structure of the regenerator in accordance with an embodiment of this invention.

FIG. 1 shows a schematic plan view of the regenerator in accordance with an embodiment of this invention. The embodiment shown is a two-phase charge coupled device with a stepped oxide to obtain directionality. Charge packets to be regenerated are received from a conventional semiconductor charge transfer device section 1 and regenerated charge packets are supplied to another conventional semiconductor charge transfer device section 2.

In charge transfer devices (CTDs), digital information is represented by the presence or absence of packets of charge carriers localized in and electrostatically coupled to artificially induced potential wells, usually adjacent an interface with a superimposed material. Advantageously, the potential wells are formed and controlled by application of voltages to field plate electrodes of the type conventionally used in the metal-insulator-simiconductor (MIS) technologies. Inasmuch as the MIS art is well established and well known, it is considered unnecessary to describe in detail procedures for fabricating the structures disclosed below.

The detailed operation of the regenerator is more easily understood when FIG. 1 is considered in conjunction with cross sectional views of the regenerator. FIGS. 2 through 5 are cross sectional views taken along correspondingly numbered sections in FIG. 1.

Figure 2:
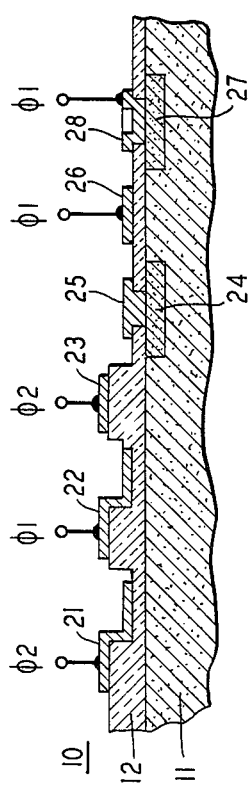
FIGS. 2 through 5 show cross sections of portions of the structure of the charge regenerator shown in FIG. 1.

FIG. 2 is a cross sectional view of a regenerator device structure 10 taken along section 2 — 2 of FIG. 1. Device 10 includes an insulating layer 12 of nonuniform thickness disposed on a semiconductive n-type substrate 11. Typically, layer 12 is silicon dioxide and substrate 11 is n-type silicon with phosphorous impurities at a concentration of about $10^{15}$ per cubic centimeter.

Overlying layer 12 are charge transfer field plate electrodes 21 and 22. As shown in FIG. 2, each electrode includes a first portion overlying a relatively thick region of insulating layer 12 and a second portion overlying a relatively thin region of insulating layer 12. Electrodes 21 and 22 are connected to a conventional associated timing circuit (not shown) to receive therefrom drive pulses $\phi 2$ and $\phi 1$, respectively. Charge packets are transfered along a charge flow path in substrate 11 beneath electrodes 21 and 22. Typically, this path is a continuation of the charge flow path of charge transfer device section 1.

A sensing impurity zone 24 shown in FIG. 2 is a p-type conductivity region located in substrate 11. Typically, zone 24 contains boron impurities at a concentration of about $10^{18}$ per cubic centimeter. A charge transfer field plate electrode 23 overlies a relatively thick portion of layer 12 and is located between electrode 22 and sensing impurity zone 24. A control field plate electrode 25 on layer 12 contacts sensing impurity zone 24 through an opening in layer 12 above zone 24. Overlying a relatively thin region of layer 12 and adjacent to impurity zone 24 is a charge transfer field plate electrode 26. Adjacent to electrode 26 is a p-type impurity zone 27 formed in substrate 11. Overlying layer 12 and above impurity zone 27 is a charge sink electrode 28 which contacts impurity zone 27 through an opening in layer 12. Field plate electrode 23 is connected to drive pulse $\phi 2$ and field plate electrodes 26 and 28 are connected to drive pulse $\phi 1$.

In FIG. 1 solid line patterns 21, 22, 23, 25, 26 and 28 represent electrodes identified by the same reference numerals used in FIG. 2. Broken line patterns 24 and 27 represent impurity zones identified by the same reference numerals used in FIG. 2. Driving pulse lines likewise are correspondingly identified.

Figure 6A:
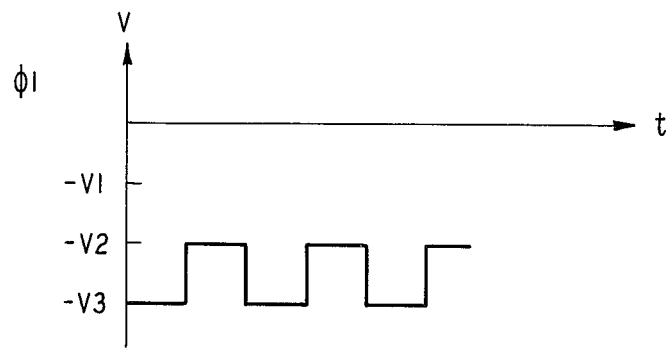
FIGS. 6A through 6C show the waveforms of the voltages applied to the regenerator.
Figure 6B:
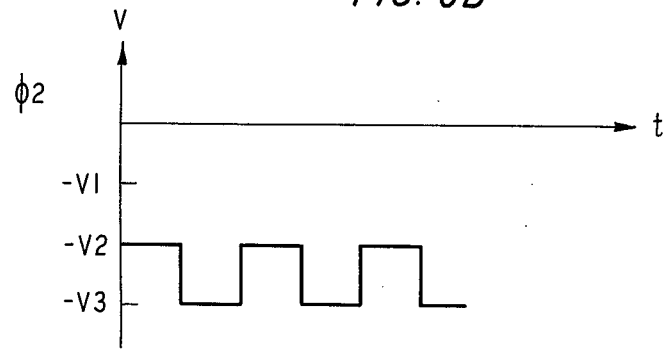
Figure 6C:
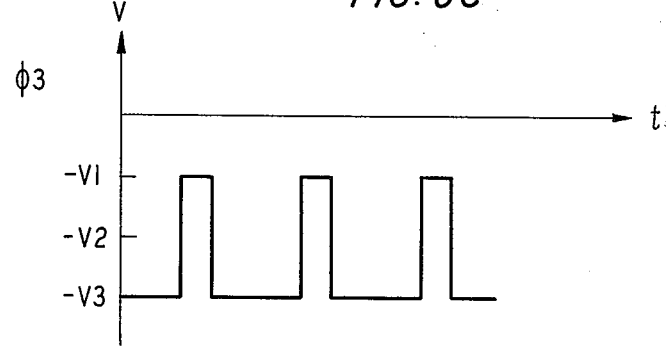

Illustrative waveforms of the voltages applied to the electrodes of this two phase embodiment of the regenerator are shown in FIGS. 6A through 6C. Driving pulses $\phi 1$ and $\phi 2$ are both square waves which are 180° out of phase and vary between $-V2$ volts and $-V3$ volts. A driving pulse $\phi 3$ is a periodic square pulse rising from $-V3$ volts to $-V1$ volts when $\phi 1$ rises to $-V2$ and goes to $-V3$ before $\phi 1$ goes to $-V3$. The voltages V1, V2 and V3 are taken as positive numbers; and V3 is greater than V2 which, in turn, is greater than V1. Typical values for the voltages are V1= 2 volts, V2= 8 volts and V3= 16 volts.

In operation, charge packets are transferred sequentially under field plate electrodes 21, 22 and 23 to sensing impurity zone 24. The flow of charge packets from impurity zone 24 to impurity zone 27 is controlled by field plate electrode 26. Charge carriers leave sensing impurity zone 24 when their potential level is in excess of the potential barrier provided by field plate electrode 26. Likewise, charge carriers at a potential level below the potential barrier underlying electrode 26 remain in sensing impurity zone 24. Sensing impurity zone 24 can be regarded as "calibrated" when charge carriers have filled any charge storage capacity of zone 24 at a potential level below the lowest potential barrier provided by field plate electrode 26. Typically, this occurs after a few cycles of charge transfer. It means that the same number of charge carriers which subsequently enter impurity zone 24 will leave zone 24. It also means that the surface potential variation of zone 24 and therefore the potential of control electrode 25 will be proportional to the charge packets entering zone 24. Further, the period of variation of the surface potential is the same as the period of drive pulses $\phi 1$ and $\phi 2$.

The purpose of electrode 28 and impurity zone 27 is to provide a charge sink for charge carriers from sensing impurity zone 24. Accordingly, since electrode 28 does not have to provide a barrier to charge flow, it can alternatively be connected to a fixed negative potential, $-V3$, instead of to drive pulse $\phi 1$. If electrode 28 remains connected to drive pulse $\phi 1$, one continuous metallization can be used to form electrodes 26 and 28.

Figure 3:
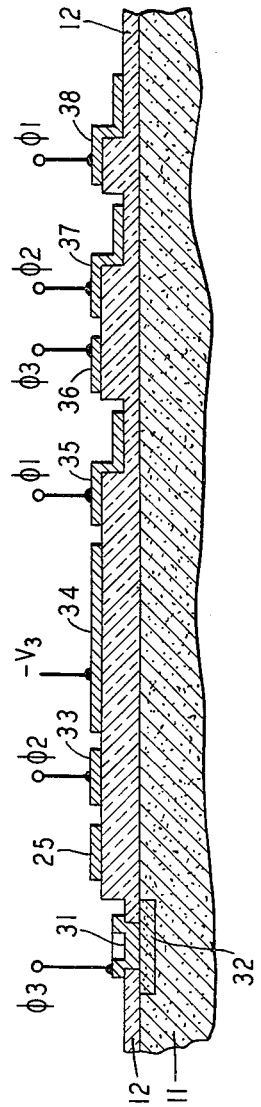

FIG. 3 shows a cross section taken along section 3 — 3 of FIG. 1. A p-type impurity zone 32 is formed in substrate 11 and an electrode 31 overlies layer 12 and contacts impurity zone 32 through an opening in layer 12. Drive pulse $\phi 3$ is connected to electrode 31. Overlying a relatively thick region of layer 12 and arranged in a line from electrode 31 are, in succession, control electrode 25, a blocking electrode 33 and an amplifying electrode 34. Blocking electrode 33 is connected to drive pulse $\phi 2$ and amplifying electrode 34 is connected to $-V3$.

When drive pulse $\phi 3$ is at potential level $-V1$, there is an outward flow of charge carriers from zone 32 to an induced potential well beneath amplifying electrode 34 and blocking electrode 33. It is advantageous to make blocking electrode 33 small so the size of amplifying electrode 34 substantially determines the size of the induced potential well and therefore the amount of "amplified charge". When the $-V1$ potential level pulse terminates, electrodes 31 and 34 both have an applied potential of $-V3$ and charge begins to flow back from under amplifying electrode 34 to impurity zone 32. Limiting this backward flow of charge is control electrode 25 between amplifying electrode 34 and impurity zone 32.

A potential barrier beneath control electrode 25 is set by the surface potential created in sensing impurity zone 24. The magnitude of the surface potential is dependent on the charge from charge transfer device 1 stored in zone 24 and the capacitance of zone 24. Charge packets in sensing impurity 24 representing a logical one form a higher potential barrier than charge packets representing a logical zero. Since the potential barrier under control electrode 25 varies at the same rate as drive pulses $\phi 1$ and $\phi 2$ which control the transfer of charge from charge transfer device section 1, the potential barrier remains longer than the duration of the $-V1$ potential level of drive pulse $\phi 3$ applied to source electrode 31. Accordingly, the potential level of the charge carriers stored under amplifying electrode 34 reaches the same level as the potential barrier under control electrode 25. Charge carriers can initially pass over the potential barrier because the $-V1$ potential level of drive pulse $\phi 3$ applied to source electrode 31 is greater than the peak potential barrier under control electrode 25.

To prevent backward flow of charge carriers stored under amplifying electrode 34 when the potential barrier under control electrode 25 is reduced, blocking electrode 33 is located between control electrode 25 and amplifying electrode 34. Because blocking electrode 33 is connected to drive pulse $\phi 2$ it provides a potential barrier to backward flow of charge stored under electrode 34 until the charge is transferred to under a subsequent electrode. An alternative is to use an additional drive pulse so charge can be transferred from under electrode 34 before the potential barrier under control electrode 25 is reduced.

Amplifying electrode 34 is connected to the voltage $-V3$ which, in conjunction with the capacitance of amplifying electrode 34, determines the charge storage capacity of a potential well beneath amplifying electrode 34. The size of the potential well and the height of the potential barrier under control electrode 25 determine the amount of charge stored. The ratio of the charge stored under amplifying electrode 34 to the charge stored in sensing impurity zone 24 is proportional to the ratio of the capacitance of amplifying electrode 34 to the capacitance of sensing diffusion 24. The ratio is an amplification factor of the charge packets from charge transfer device section 1. The magnitude of the amplification factor is chosen to take into consideration the charge transfer imperfections of charge transfer device section 1. After amplification, the charge difference between packets representing logical ones and zeros should at least equal the charge in a full potential well. Therefore, the closer that the charge packets representing logical ones and zeros are in magnitude the greater will be the required amplification.

Figure 4:
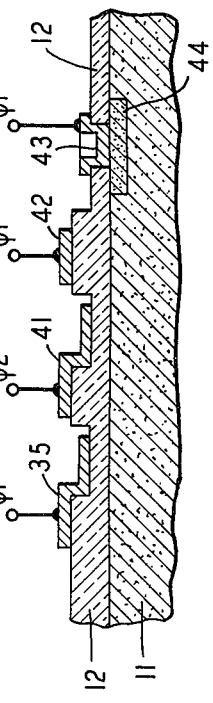

Subsequent to the amplifying electrode 34 in the direction of charge flow is an electrode 35 overlying layer 12. Electrode 35 is connected to drive pulse $\phi 1$ and acts to split the flow of charge carriers from beneath amplifying electrode 34 into two paths. One path is the main charge flow path shown in FIG. 3. The other is a subtraction path shown in FIG. 4 which is a cross section of FIG. 1 along section 4 — 4. Referring to FIGS. 1, 3 and 4 it can be seen that electrode 35 has a first portion formed over a relatively thick region of layer 12 and a second portion formed over a relatively thin region of layer 12.

The subtraction path of FIG. 4 removes an amount of charge equal to a logical 0 from the charge which flows into the region under electrode 35. Adjacent to electrode 35 in the subtraction path is a transfer electrode 41 having a first portion formed over a relatively thick region of layer 12 and a second portion formed over a relatively thin region of layer 12. Further along the subtraction path are, in succession, an electrode 42 overlying a relatively thick region of layer 12 and a sink electrode 43 formed on layer 12 and contacting, through an opening in layer 12 a p-type impurity zone 44 in substrate 11. Electrode 41 is connected to drive pulse $\phi 2$. Electrodes 42 and 43 are both connected to $\phi 1$.

In operation, electrode 41 induces a potential well with a charge storage capacity equal to the amount to be subtracted from the charge carriers stored under electrode 35. Charge from under electrode 41 is transferred to impurity zone 44 when a potential barrier under electrode 42 is reduced. Impurity zone 44 is part of a charge sink arrangement which also includes electrode 43. Electrodes 42 and 43 can be one continuous metallization since they are both connected to drive pulse $\phi 1$. Alternatively, sink electrode 43 can remain separate and be connected to fixed potential level $-V3$. The fixed potential can be used instead of drive pulse $\phi 1$ because electrode 43 doesn't have to provide a variable height potential barrier.

To be sure that the potential well under electrode 41 is full, the charge from under field plate electrode 35 is advantageously temporarily blocked from proceeding in the main charge flow path shown in FIG. 3. To this end, a diverting field plate electrode 36 is located adjacent electrode 35 and overlies a relatively thick region of layer 12. Field plate electrode 36 is connected to drive pulse $\phi 3$ and induces an underlying potential barrier to block charge transfer toward the output of the regenerator while the potential well beneath field plate electrode 41 is filling up. It should be understood that since electrode 36 only serves to provide this slight delay in opening up the charge path to the output of the regenerator, other alternatives such as a different geometric arrangement of electrodes can be used to insure that the subtraction takes place.

Continuing with the charge flow path in FIG. 3, when the $-V1$ potential level of drive pulse $\phi 3$ terminates, charge flows past electrode 36 to a limiting electrode 37. Limiting electrode 37 is connected to drive pulse $\phi 2$ and splits the flow of charge carriers into two paths. One path is a continuation of the charge flow path in FIG. 3. The other path is an excess charge path along section 5 — 5 of FIG. 1 shown in FIG. 5. Charge entering the region under electrode 37 in excess of the amount needed to represent a logical 1 flows in the excess charge path. The amount of charge needed to represent a logical 1 is transferred along the charge path of FIG. 3.

Figure 5:
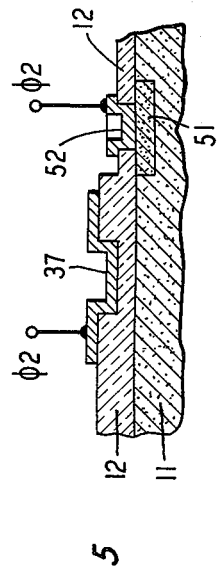

Splitting charge flow between the two paths is done by the shape of electrode 37 in conjunction with appropriate application of voltages. Referring to FIGS. 1, 3 and 5 it can be seen that electrode 37 has a first portion formed on a relatively thick region of layer 12, a second portion formed on a relatively thin region of layer 12 and, only in the excess charge path, a third portion formed on a relatively thick region of layer 12. In particular, from FIG. 5 it can be seen that the second portion of electrode 37 can provide a central potential well which can store charge.

Adjacent limiting electrode 37 in the excess charge path is a p-type conductivity impurity zone 51 formed in substrate 11. Formed on layer 12 is a sink electrode 52 which contacts impurity zone 51 through an opening in layer 12. Electrode 52 is connected to drive pulse $\phi 2$. Since electrodes 37 and 52 are both connected to drive pulse $\phi 2$, all charge entering the region under electrode 37 flows into impurity zone 51 beneath electrode 52 except for the charge stored under the central portion of electrode 37. Electrodes 37 and 52 can be one continuous metallization since they are both connected to drive pulse $\phi 2$. Alternatively, electrode 37 can remain separate and be connected to fixed potential level $-V3$.

Adajcent the second portion of limiting electrode 37 in the main charge flow path shown in FIG. 3 is a stepped electrode 38. Electrode 38 is connected to drive pulse $\phi 1$ and has a first portion formed on a relatively thick region of layer 12 and a second portion formed on a relatively thin region of layer 12. Since limiting electrode 37 appears as a simple stepped electrode without a central potential well along the main charge path of FIG. 3, transfer of charge from beneath electrode 37 to beneath electrode 38 occurs when drive pulse $\phi 1$ induces a potential well beneath electrode 38 deeper than the potential well induced beneath electrode 37 by drive pulse $\phi 2$. The amount of charge transferred is the amount that was stored in the potential well under the second portion of electrode 37 which is formed on the relatively thin portion of layer 12.

As with FIG. 2, FIG. 1 is numbered corresponding to FIGS. 3, 4 and 5. In FIG. 1 solid line patterns 31, 33, 34, 35, 36, 37, 38, 41, 42, 43 and 52 represent electrodes. Broken line patterns 32, 44 and 51 represent impurity zones. Driving pulse lines and voltage V3 likewise are correspondingly identified.

The size of the potential well under the second portion of electrode 37 is advantageously as large as the smallest potential well in subsequent charge transfer device 2. If the potential well is larger, too much charge may be introduced into charge transfer device 2. Variation in sizes of potential wells in charge transfer devices can be due to fabrication variations. For example, if a subsequent charge transfer device uses stepped oxide for directionality, the alignment between the oxide step and the stepped electrode determines the size of the storage potential well in the charge transfer device.

It is known that in some charge transfer devices it is advantageous that a logical zero is represented by a small amount of charge instead of no charge. Such a logical 0 has been called the "fat 0" and can be used in this regenerator. One way to produce the fat 0 is to adjust the size of the potential well under subtracting electrode 41 so that the amount subtracted is less than the charge representing a logical 0 after multiplication. One drawback of this approach is that variation of the transfer efficiency of charge transfer device section 1 changes the size of the charge packet of a logical 0 after multiplication and necessitates that a different amount be subtracted to maintain a fat 0 of the same size. Changing the amount to be subtracted is an undesirable complication.

Figure 7:
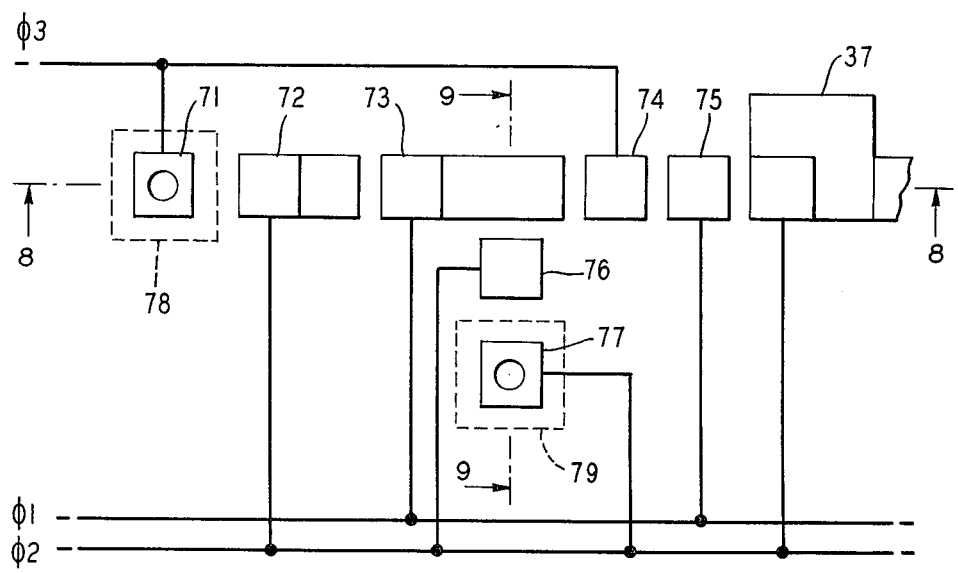
FIG. 7 shows a schematic plan view of the layout of the structure for introducing a "fat zero"
Figure 8:
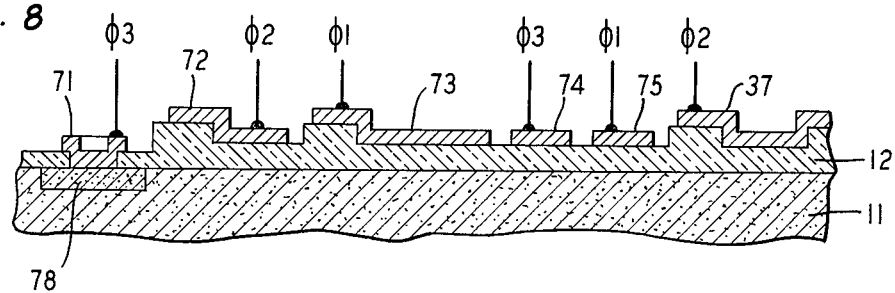
FIGS. 8 and 9 show cross sections of portions of the structure shown in FIG. 7.
Figure 9:
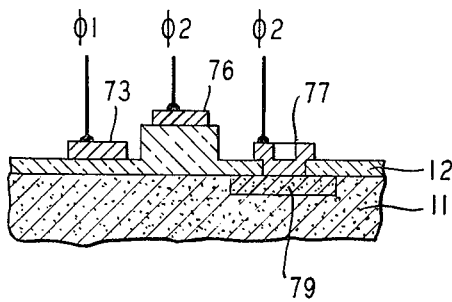

Another way to produce a fat 0 is to use additional circuitry whose schematic plan view is shown in FIG. 7. The charge for the fat 0 is introduced into the circuit of FIG. 1 at electrode 37. Electrode 37 also appears in FIG. 7. FIG. 8 is a cross section taken along section 8 — 8 of FIG. 7 and FIG. 9 is a cross section taken along section 9 — 9 of FIG. 7. The circuit can be formed in the same material as the regenerator circuit and, as shown in FIGS. 8 and 9, includes substrate 11 and overlying insulating layer 12.

Referring to FIG. 8, a p-type impurity zone 78 is located in substrate 11. A source electrode 71 overlies layer 12 and contacts impurity zone 78 through an opening in layer 12. Along the charge path shown in FIG. 8 there are, in succession after electrode 71 and overlying layer 12, a charge transfer electrode 72, a charge storage electrode 73, a charge dividing electrode 74 and a fat 0 electrode 75. Electrodes 72 and 73 each have first portions on relatively thick regions of layer 12 and second portions on relatively thin regions of layer 12. Electrodes 74 and 75 are formed on relatively thin regions of layer 12. Electrode 75 is located adjacent limiting electrode 37 of FIG. 1. Electrodes 71 and 74 are connected to drive pulse $\phi 3$; electrode 72 is connected to drive pulse $\phi 2$; electrode 73 and 75 are connected to drive pulse $\phi 1$.

Referring to FIG. 9, the fat zero circuit further includes a transfer electrode 76 located adjacent to electrode 73 and overlying a relatively thick region of layer 12. A p-type impurity zone 79 is formed in substrate 11 adjacent transfer electrode 76. A sink electrode 77 overlies layer 12 and contacts impurity zone 79 through a contact opening in layer 12. Electrodes 76 and 77 are connected to drive pulse $\phi 2$.

FIG. 7 is numbered corresponding to FIGS. 8 and 9. In FIG. 7 solid line patterns 71, 72, 73, 74, 75, 76 and 77 represent electrodes. Broken line patterns 78 and 79 represent impurity zones. Driving pulse lines are likewise correspondingly numbered.

In operation, the circuitry shown in FIG. 7 splits an amount of charge stored under electrodes 73, 74 and 75 so the amount of charge desired for a fat zero is stored under fat zero electrode 75. Charge carriers are provided by source electrode 71 contacting impurity zone 78. A potential well induced beneath transfer electrode 72 has a charge storage capacity advantageously equal to the minimum charge storage capacity of a potential well of charge transfer device 2. That amount of charge is transferred from inpurity zone 78 to transfer electrode 73. The charge spreads out beneath the second portion of transfer electrode 73 as well as electrode 74 and electrode 75. This is because electrodes 74, 75 and the second portion of electrode 73 all have induced potential wells of the same depth beneath them.

When the potential level $-V1$ from drive pulse $\phi 3$ commences, a potential barrier is formed under dividing electrode 74 and the charge stored under electrode 73 is split from that stored under electrode 75. The ratio of the area of the second portion of electrode 73 to the area of electrode 75 is such that the desired amount of charge for a fat zero is stored under electrode 75. This amount is then transferred to limiting electrode 37. The amount of charge stored under electrode 73 is transferredd along a charge transfer path shown in FIG. 9 to a charge sink arrangement. Electrode 76 induces an underlying potential barrier which regulates the flow of charge carriers from beneath electrode 73 to impurity zone 79. As with previous charge sink arrangements, electrodes 76 and 77 can be joined or, alternatively, electrode 77 can be connected to a fixed potential level.

It should be understood that the regulator is equally applicable to charge transfer devices other than that described. For example, charge coupled devices having other than two phases can use this regenerator as can bucket brigade devices. Further, in a two phase system the directionality can be obtained by means other than the stepped oxide. For example, a dc bias or an impurity zone under part of one electrode are alternative means of obtaining an asymmetry to provide the desired directionality.

What is claimed is:

1. A semiconductor apparatus including first and second charge transfer device sections of the type adapted for the storage and serial transfer of charge carriers localized in induced potential wells along a surface portion of a body by sequentially applying a plurality of differing potentials to successive portions of the surface and further adapted for logical bit regeneration, said apparatus comprising:

means for detecting a charge packet output of the first charge transfer device section and for multiplying said charge packet by a multiplication factor so that after multiplication the difference in the amount of charge in a charge packet representing a logical 1 and in a charge packet representing a logical 0 is at least as great as the maximum charge storage capacity of a potential well of the second charge transfer device section, said means for multiplying including a semiconductor charge storage region controlled by an overlying electrode of such geometry as to produce a sufficient storage capacitance that the region in response to said output stores a charge packet which is amplified compared with the storage packet output;

means for subtracting a fixed quantity of charge from the multiplied charge packet, sufficient to remove the charge of a charge packet representing a logical zero, said means for subtracting including a second semiconductor charge storage region controlled by an overlying electrode; and means including a localized impurity zone charge sink for limiting the amount of charge in the charge packet to a maximum value equal to the minimum charge storage capacity of a potential well of the second charge transfer device section.

2. Apparatus as recited in claim 1 wherein the means for multiplying includes:

means for detecting the charge carriers in the charge packet, means for producing a potential level proportional to the number of charge carriers in the charge packet, means for providing a source of charge carriers, means for providing a charge storage region with a charge storage capacity at least as great as the charge packet, means for providing a charge flow path between the charge source and the charge storage region, means for inducing a potential barrier proportional to the potential level in the charge flow path between the charge source and the charge storage region, and means for filling the charge storage region to a potential level equal to the potential barrier.

3. Apparatus as recited in claim 2 wherein the means for filling the charge storage region includes:

means for applying a potential level greater than the potential barrier to the source of charge carriers, means for filling the charge storage region to the potential level applied to the source of charge carriers, means for reducing the potential level applied to the source of charge carriers to below the level of the potential barrier, and means for reducing the potential level of the charge carriers in the charge storage region to the potential level of the potential barrier.

4. Apparatus as recited in claim 1 wherein the means for subtracting includes:

means for filling a charge storage region having a charge storage capacity equal to the amount to be subtracted with charge from the multiplied charge packet, and means for retaining the remainder of the multiplied charge packet.

5. Apparatus as recited in claim 1 wherein the means for limiting includes:

means for filling a charge storage region having a charge storage capacity equal to the minimum charge storage capacity of a potential well of the charge storage device with charge carriers from the charge packet, means for removing the remaining charge carriers in the charge packet, and means for retaining the charge carriers stored in the charge storage region.

6. Apparatus as recited in claim 1 further comprising:
means for providing a charge packet equal in size to that representing a logical one, means for splitting the charge packet into parts whereby one of the parts is a small amount of charge relative to the amount of charge representing a logical 1, and means for adding the small amount of charge to the charge packet to be regenerated after subtraction of the fixed quantity of charge.

7. A semiconductor apparatus of the type adapted for the storage and serial transfer of charge carriers localized in induced potential wells along a surface portion of a body of a first type semiconductivity by sequentially applying a plurality of differing potentials to successive portions of the surface through field plate electrodes and further adapted for logical bit regeneration, said apparatus comprising:

a first zone of a second type semiconductivity disposed within the body and adjacent one of the field plate electrodes for sensing the number of charge carriers existing under said one field plate electrode, a second zone of the second type semiconductivity disposed within the body, a source electrode contacting the second zone for supplying charge carriers, an output electrode for accumulating charge carriers and creating an output potential well, and a control field plate electrode in contact with the first zone, disposed over and insulated from the body, and between the source electrode and the output electrode for creating in the body beneath the control field plate electrode a control potential barrier, the apparatus further including:

an amplifying field plate electrode disposed over and insulated from the body and between the control field plate electrode and the output electrode, for creating in the body beneath the amplifying field plate electrode an amplifying potential well with a charge storage capacity greater than the charge storage capacity of the first zone, a third zone of the second type semiconductivity disposed within the body, a first sink field plate electrode contacting the third zone for accumulating charge carriers, a transfer field plate electrode disposed over and insulated from the body, and between the amplifying field plate electrode and the output electrode and between the amplifying field plate electrode and the first sink field plate electrode, for creating in the body beneath the transfer field plate electrode a transfer potential well with a charge storage capacity at least as great as the charge storage capacity of the amplifying potential well, a subtraction field plate electrode disposed over and insulated from the body, and between the transfer field plate electrode and the first sink field plate electrode, for creating in the body beneath the subtraction field plate electrode a subtraction potential well with a charge storage capacity less than the charge storage capacity of the amplifying potential well, a fourth zone of the second type semiconductivity disposed within the body, a second sink field plate electrode contacting the fourth zone for accumulating charge carriers, and a limiting field plate electrode disposed over and insulated from the body and between the transfer field plate electrode and the output electrode and between the transfer field plate electrode and the second sink field plate electrode, for creating in the body beneath the limiting field plate electrode a limiting potential well with a charge storage capacity not greater than the charge storage capacity of the output potential well.

8. Apparatus as recited in claim 7 in combination with means for applying to the source electrode a potential level of greater magnitude and shorter duration than the magnitude and duration of any potential level of the control potential barrier.

9. Apparatus as recited in claim 7 in combination with means for maintaining a DC bias potential on the amplifying field plate electrode.

10. A semiconductor apparatus as recited in claim 7 further comprising:

a blocking electrode disposed over and insulated from the body, and between the control electrode and the amplifying electrode for creating in the body beneath the blocking electrode a potential barrier.

11. A semiconductor apparatus as recited in claim 7 further comprising:

a diverting field plate electrode disposed over and insulated from the body, and between the transfer field plate electrode and the limiting electrode for creating in the body beneath the diverting field plate electrode a potential barrier.

12. Apparatus as recited in claim 11 in combination with means for applying to the blocking electrode a potential level of greater magnitude and shorter duration than the magnitude and duration of any potential level applied to the transfer electrode.

13. A semiconductor apparatus as recited in claim 7 further comprising an intermediate field plate electrode disposed over and insulated from the body, and between the subtraction field plate electrode and the first sink field plate electrode creating in the body beneath the intermediate field plate electrode a potential barrier.

14. A semiconductor apparatus as recited in claim 13 wherein the intermediate field plate electrode and the first sink field plate electrode are conductively connected.

15. A semiconductor apparatus as recited in claim 7 further including means for generating a charge packet representing a logical zero comprising:

a fifth zone of the second type semiconductivity disposed within the body and spaced from the limiting electrode, a second source electrode contacting the fifth zone for supplying charge carriers, a second transfer field plate electrode disposed over and insulated from the body, and between the second source electrode and the limiting electrode for creating in the body beneath the second transfer field plate electrode a second transfer potential well with a charge storage capacity not greater than the charge storage capacity of the output potential well, a storage field plate electrode disposed over and insulated from the body, and between the second transfer electrode and the limiting electrode for creating in the body beneath the storage field plate electrode a storage potential well, a dividing field plate electrode disposed over and insulated from the body, and between the storage field plate electrode and the limiting electrode for creating in the body beneath the dividing field plate electrode a potential barrier, a fat zero electrode disposed over and insulated from the body, and between the dividing field plate electrode and the limiting electrode for creating in the body beneath the fat zero electrode a fat zero potential well, with a charge storage capacity greater than zero, a sixth impurity zone of the second type semiconductivity disposed within the body and spaced from the storage field plate electrode, a third sink field plate electrode contacting the sixth zone for accumulating charge carriers, and a barrier field plate electrode disposed over and insulated from the body, and between the third sink field plate and the storage field plate electrode for creating in the body beneath the barrier field plate electrode a potential barrier to control the flow of charge carriers from the storage potential well to the sixth zone.

16. A semiconductor apparatus as recited in claim 15 wherein:
the barrier field plate electrode and the third sink field plate electrode are conductively connected.

17. A semiconductor apparatus as recited in claim 15 wherein:
the ratio of the charge storage capacity of the fat zero potential well to the charge storage capacity of the storage potential well is the same as the ratio of the amount of charge in a logical zero to the amount of charge difference between a logical one and a logical zero.

18. Apparatus as recited in claim 15 in combination with means for applying to the dividing field plate electrode a potential level greater in magnitude and shorter in duration than the magnitude and duration of any potential level applied either to the storage field plate electrode or to the fat zero electrode.

19. A method for use with a charge transfer device for regenerating charge packets emanating from a first transfer device section for injection into a second transfer device section, said packets representing logical 1's and 0's comprising the steps of:
multipying a charge packet emanating from the first transfer device section by a multiplication factor so that after multiplication the difference in the amount of charge in a charge packet representing a logical 1 and in a charge packet representing a logical 0 is at least as great as the maximum charge storage capacity of a potential well of the second transfer section,
subtracting by shifting a fixed quantity of charge from the multiplied charge packet, sufficient to remove the charge of a charge packet representing a logical 0, and
limiting the amount of charge in the charge packet to a maximum value equal to the minimum charge storage capacity of a potential well of the second transfer device section by shifting of excess charge into a localized impurity zone charge sink.

20. A method of regenerating charge as recited in claim 19 further comprising adding to a charge packet representing a logical 0 a small amount of charge relative to the amount of charge representing a logical 1.

21. A method as recited in claim 20 wherein the charge is added by the steps of:
providing a charge packet equal in size to that representing a logical 1,
splitting the charge packet into parts whereby one of the parts is the magnitude of the desired charge addition to a logical 0, and
adding the part equal to the magnitude of the desired charge addition to the charge packet to be regenerated after subtraction of the fixed quantity of charge.

22. A method as recited in claim 19 wherein multiplying the charge packet comprises the steps of:
detecting the charge carriers in the charge packet,
producing a potential level proportional to the number of charge carriers in the charge packet,
providing a source of charge carriers,
providing a charge storage region with a charge storage capacity at least as great as the charge packet,
providing a charge flow path between the charge source and the charge storage region,
inducing a potential barrier proportional to the potential level in the charge flow path between the charge source and the charge storage region, and
filling the charge storage region to a potential level equal to the potential barrier.

23. A method as recited in claim 22 wherein filling the charge storage region to a potential level equal to the potential barrier comprises the steps of:
applying a potential level greater than the potential barrier to the source of charge carriers,
filling the charge storage region to the potential level applied to the source of charge carriers,
reducing the potential level applied to the source of charge carriers to below the level of the potential barrier, and
reducing the potential level of the charge carriers in the charge storage region to the potential level of the potential barrier.

24. A method as recited in claim 19 wherein subtracting a fixed quantity of charge from the multiplied charge packet comprises the steps of:
filling a charge storage region having a charge storage capacity equal to the amount to be subtracted with charge from the multiplied charge packet, and
retaining the remainder of the multiplied charge packet.

25. A method as recited in claim 19 wherein limiting the amount of charge in the packet comprises the steps of:
filling a charge storage region having a charge storage capacity equal to the minimum charge storage capacity of a potential well of the charge storage device with charge carriers from the charge packet,
removing the remaining charge carriers in the charge packet, and
retaining the charge carriers stored in the charge storage region.

* * * * *